(12) United States Patent
Mauder et al.

(10) Patent No.: US 9,064,953 B2
(45) Date of Patent: Jun. 23, 2015

(54) SEMICONDUCTOR DEVICE INCLUDING A DRIFT ZONE AND A DRIFT CONTROL ZONE

(71) Applicant: Infineon Technologies Austria AG, Villach (AT)

(72) Inventors: Anton Mauder, Kolbermoor (DE); Franz Hirler, Isen (DE); Otto Wiedenbauer, Unterhaching (DE)

(73) Assignee: Infineon Technologies Austria AG, Villach (AT)

( * ) Notice: Subject to any disclaimer, the term of this patent is extended or adjusted under 35 U.S.C. 154(b) by 49 days.

(21) Appl. No.: 13/915,934

(22) Filed: Jun. 12, 2013

(65) Prior Publication Data

US 2014/0367772 A1 Dec. 18, 2014

(51) Int. Cl.
H01L 29/66 (2006.01)
H01L 29/78 (2006.01)
H01L 29/40 (2006.01)
H01L 29/06 (2006.01)

(52) U.S. Cl.
CPC .......... *H01L 29/7813* (2013.01); *H01L 29/402* (2013.01); *H01L 29/404* (2013.01); *H01L 29/66666* (2013.01); *H01L 29/0611* (2013.01); *H01L 29/66477* (2013.01); *H01L 29/7811* (2013.01); *H01L 29/66712* (2013.01); *H01L 29/0607* (2013.01); *H01L 29/0619* (2013.01); *H01L 29/0615* (2013.01); *H01L 29/0638* (2013.01); *H01L 29/0634* (2013.01); *H01L 29/063* (2013.01)

(58) Field of Classification Search
CPC . H01L 29/402; H01L 29/404; H01L 29/7811; H01L 29/0611; H01L 29/66477; H01L 29/66666; H01L 29/66712; H01L 29/0619; H01L 29/0607; H01L 29/0615; H01L 29/063; H01L 29/0634; H01L 29/0638
See application file for complete search history.

(56) References Cited

U.S. PATENT DOCUMENTS

| | | | |
|---|---|---|---|
| 8,247,874 B2 | 8/2012 | Hirler et al. | |
| 2004/0043565 A1* | 3/2004 | Yamaguchi et al. | 438/268 |
| 2004/0218621 A1* | 11/2004 | Dove | 370/445 |
| 2007/0023830 A1 | 2/2007 | Pfirsch et al. | |
| 2007/0108513 A1 | 5/2007 | Rub et al. | |
| 2009/0218621 A1 | 9/2009 | Pfirsch et al. | |

FOREIGN PATENT DOCUMENTS

EP 2261992 A2 7/2006

OTHER PUBLICATIONS

Mauder et al. "Semiconductor Arrangement with a Power Transistor and a High Voltage Device Integrated in a Common Semiconductor Body." U.S. Appl. No. 13/429,579 filed Mar. 26, 2013.

\* cited by examiner

*Primary Examiner* — Fei Fei Yeung Lopez
(74) *Attorney, Agent, or Firm* — Murphy, Bilak & Homiller, PLLC

(57) ABSTRACT

A semiconductor device includes a semiconductor body having a drift zone of a first conductivity type and a drift control zone. A junction termination structure is at a first side of the semiconductor body. A first dielectric is between the drift zone and the drift control zone. A second dielectric is at a second side of the semiconductor body. The drift control zone includes a first drift control subregion of the first conductivity type and a second drift control subregion of a second conductivity type between the first drift control subregion and the second dielectric.

25 Claims, 9 Drawing Sheets

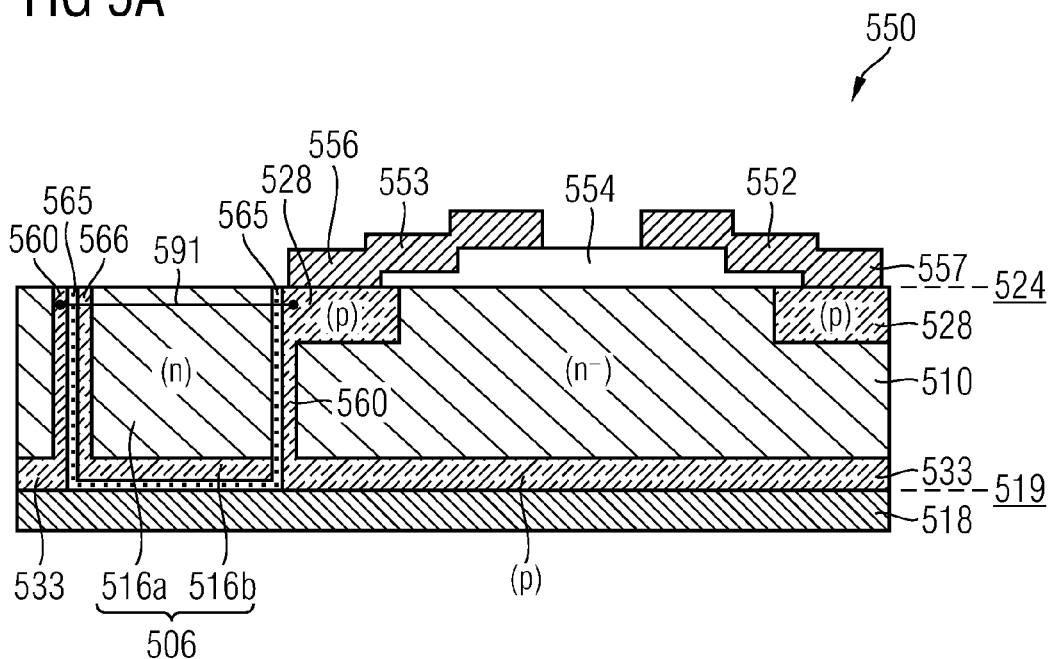
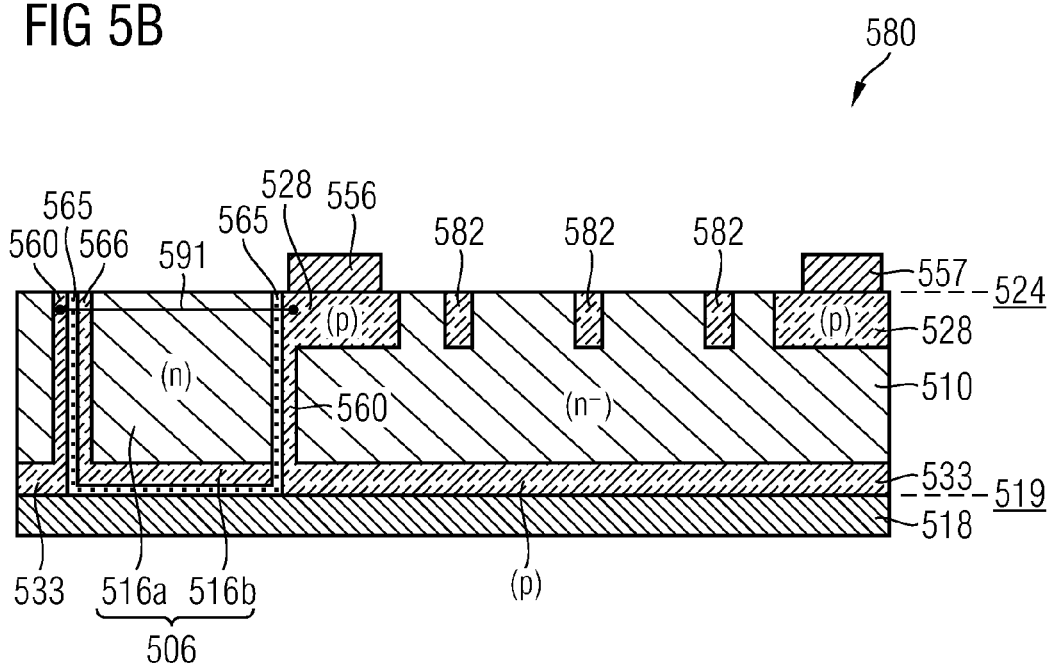

SEMICONDUCTOR DEVICE INCLUDING A DRIFT ZONE AND A DRIFT CONTROL ZONE

BACKGROUND

One aim in the development of semiconductor components such as power semiconductor components lies in an improvement of a tradeoff between a high voltage blocking capability and a low on-state resistance combined with low switching losses.

For alternating current voltage applications semiconductor components having bidirectional voltage blocking capabilities are desirable for replacing mechanical relays and for allowing synchronous rectification.

A semiconductor component with an improved trade-off between the voltage blocking capability and the on-state resistance combined with low switching losses is desirable.

SUMMARY

According to an embodiment of a semiconductor device, the semiconductor device includes a semiconductor body. The semiconductor body includes a drift zone of a first conductivity type and a drift control zone. The semiconductor device further includes a junction termination structure at a first side of the semiconductor body. The semiconductor device further includes a first dielectric between the drift zone and a drift control zone. The semiconductor device further includes a second dielectric and a second side of the semiconductor body. The drift control zone includes a first drift control subregion of the first conductivity type and a second drift control subregion of a second conductivity type between the first drift control subregion and the second dielectric.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 5A illustrates a schematic cross-sectional view of one embodiment of a symmetric junction termination area including field plates along a line B-B' of the semiconductor device of FIG. 4A.

FIG. 5B illustrates a schematic cross-sectional view of another embodiment of a symmetric junction termination area including guard rings along the line B-B' of the semiconductor device of FIG. 4A.

DETAILED DESCRIPTION

Figure 1A:
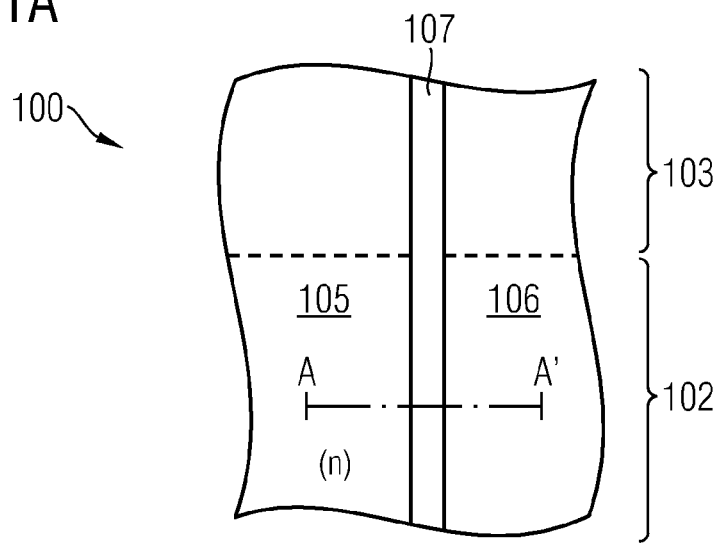
FIG. 1A illustrates a schematic top view of one embodiment of a semiconductor device including a drift zone and a drift control zone.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration, which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. A doping type of semiconductor regions illustrated in the drawings may also be vice versa, i.e. a p-doped region may be n-doped and an n-doped region may be p-doped.

FIG. 1A illustrates a schematic top view of one embodiment of a portion of a semiconductor device 100 according to an embodiment. The semiconductor device 100 includes a transistor cell array 102 and a junction termination area 103. The junction termination area 103 may surround the transistor cell array 102. The semiconductor device 100 further includes a drift zone 105, a drift control zone 106 and a first dielectric 107 between the drift zone 105 and the drift control zone 106.

Figure 1B:
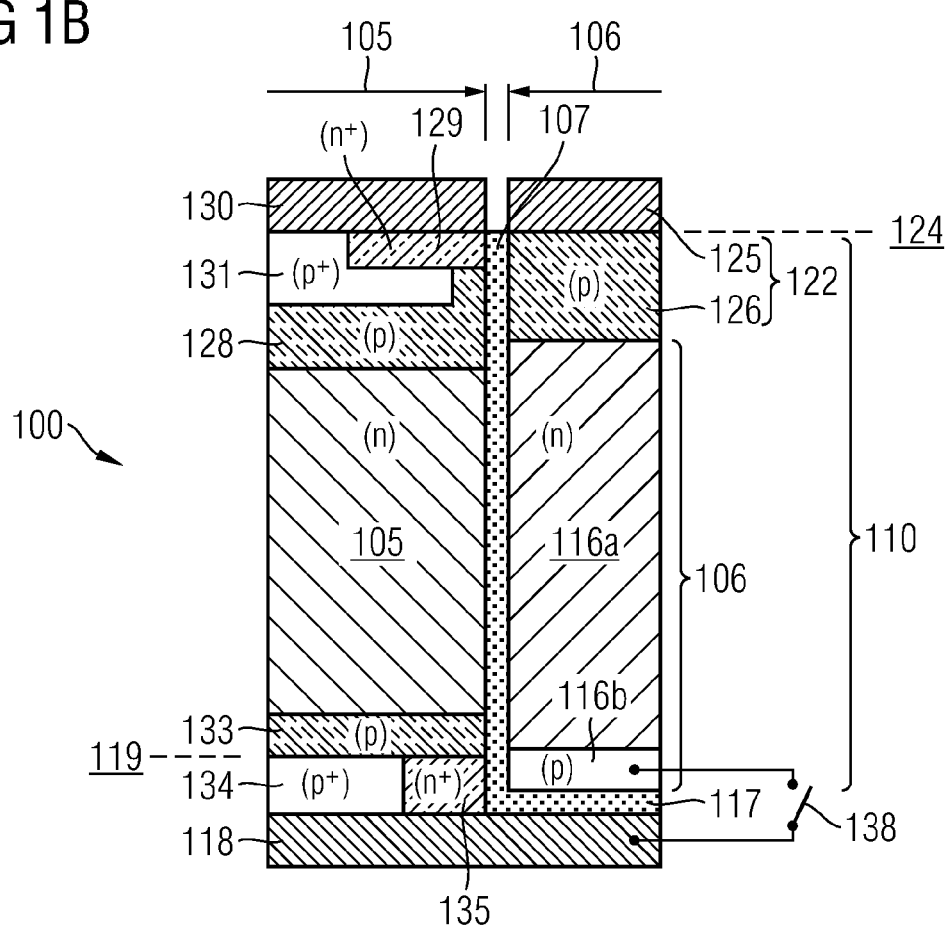
FIG. 1B illustrates a schematic cross-sectional view along a line A-A' in a cell array of the semiconductor device of FIG. 1A.

FIG. 1B is schematic illustration of the semiconductor device 100 along the line A-A' of FIG. 1A. In a semiconductor body 110, e.g. an n-doped semiconductor substrate including one or more optional semiconductor layer(s) thereon the first dielectric 107 provides a lateral electric isolation between the n-doped drift zone 105 and the drift control zone 106.

The drift control zone 106 includes a first n-doped drift control subregion 116a and a second p-doped drift control subregion 116b. According to an embodiment, the n-doped drift zone 105 and the first n-doped drift control subregion 116a are distinct parts of a same semiconductor area, e.g. the same n-doped semiconductor substrate and/or the same n-doped semiconductor layer.

A second dielectric 117 is arranged between the second p-doped drift control subregion 116b and a contact area, e.g. a drain electrode 118 including a conductive layer or conductive layer stack such as a metal layer or metal layer stack at a second side 119 of the semiconductor body 110. A gate electrode 122 and the drift control zone 106 are arranged adjacent to one another in a vertical direction perpendicular to a first side 124 of the semiconductor body 110. The gate electrode 122 is electrically coupled to the drift control zone 106. The gate electrode 122 includes a connecting electrode 125 and a p-doped semiconductor section 126 that is electrically coupled to the connecting electrode 125. The p-doped semiconductor section 126 is electrically isolated from a p-doped body region 128 that adjoins the n-doped drift zone 105 by a gate dielectric portion of first dielectric 107.

The p-doped semiconductor section 126 carries out the actual function of the gate electrode. When applying a suitable potential to the gate electrode 122, this potential at the p-doped semiconductor section 126 causes formation of a conductive inversion channel in the p-doped body region 128 near and in the face to the gate dielectric by the so-called field effect. The conductive inversion channel is a conductive path between an n+-doped source region 129 at the first side 124 and the n-doped drift zone 105.

The p-doped body region 128 and the n+-doped source region 129 are electrically coupled to a source electrode 130 at the first side 124. An optional p+-doped contact region 131 may be arranged between the p-doped body region 128 and the source electrode 130 for improving an ohmic contact or low resistive contact between the p-doped body region 128 and the source electrode 130.

Apart from the specific arrangement of contact to the n+-doped source region 129 and the p-doped body region 128 illustrated in FIG. 1B, also trench contacts providing a lateral contact to the n+-doped source region 129 and a lateral and/or vertical contact to the p-doped body region 128 with an optional p+-doped contact region may be applied. Likewise a contact to the semiconductor body 110 at the first side 124 may alternate between a first contact portion to the n+-doped source region 129 and a second contact portion to the p-doped body region 128 along a lateral direction being perpendicular to the drawing plane of FIG. 1B.

A p-doped semiconductor region 133 is arranged between the n-doped drift zone 105 and the drain electrode 118 at the second side 119. An optional p+-doped contact region 134 may be arranged between the p-doped semiconductor region 133 and the drain electrode 118 for improving an ohmic contact or low resistive contact between the p-doped semiconductor region 133 and the drain electrode 118. An n+-doped semiconductor region 135 adjoins the first dielectric 107 and the drain electrode 118 at the second side 119. An arrangement of the p-doped semiconductor region 133 and the n+-doped semiconductor region 135 is similar to the arrangement of the body region 128 and the source zone 129 at the first side 124.

A suitable electrical linking of the drift control zone 106 to the drift zone 105 results in the drift control zone 106, which may be at a different potential to that of the drift zone 105, forming an electric field influencing charge carriers in the drift zone 105 in such a manner that a channel-like charge carrier accumulation on the side of the drift zone 105 facing the drift control zone 106 occurs in a forward direction. This accumulation of charge carriers in the drift zone 105 allows for an increase in the current carrying capability of the semiconductor device 100 in comparison to a comparable structure lacking a drift control zone.

A forward operation mode and a reverse operation mode of the device 100 are described next.

In the forward operation mode, a voltage $V_D$ at the drain electrode 118 is larger than a voltage $V_S$ at the source electrode 130, i.e. $V_D>V_S$. In the reverse operation mode, the voltage $V_D$ at the drain electrode 118 is smaller than the voltage $V_S$ at the source electrode 130, i.e. $V_D<V_S$.

In the forward operation mode, the pn junction between the n-doped drift zone 105 and the p-doped body region 128 at the first side 124 is reverse-biased whereas the pn junction between the n-doped drift zone 105 and the p-doped semiconductor region 133 at the second side 119 is forward-biased. In the forward operation mode, the semiconductor device 100 may be switched on by a positive bias at the gate electrode 122 with respect to the source electrode 130. Thereby, an electron channel builds up at an interface between the dielectric 107 and the p-doped body region 128 induced by the field effect. Electrons flowing to the drain electrode 118 lead to an injection of holes from the pn junction at the second side 119 into the n-doped drift zone 105 until a voltage at the drain electrode 118 falls below a voltage of the drift control zone 106. With increasing voltage difference between the drain electrode 118 and the drift control zone 106, an electron channel builds up at an interface between the p-doped semiconductor region 133 and the dielectric 107. This electron channel shorts the pn junction at the second side 119 and improves or results in a desired ohmic characteristic. The injection of holes into the drift zone 105 accelerates the process of switching on.

In the reverse operation mode, a voltage $V_D$ at the drain electrode 118 is smaller than a voltage $V_S$ at the source electrode 130, i.e. $V_D<V_S$. In the reverse operation mode, the pn junction between the n-doped drift zone 105 and the p-doped semiconductor region 133 at the second side 119 is reverse-biased, i.e. blocking. Other than in known Extended Gate FETs (EGFETs) or Trench Extended Drain FETs (TEDFETs) having an n-doped field stop zone at a bottom side of the n-doped drift control zone 106, the semiconductor device 100 includes the second p-doped drift control subregion 116b which allows for draining off a leakage current and for reducing an electric field.

The semiconductor device 100 further includes a switch 138 electrically coupled between the second p-doped drift control subregion 116b and the drain electrode 118. Whereas in an unidirectional blocking device such as a known EGFET or TEDFET, a drain diode enables discharge of thermally generated electrons from the drift control zone to the drain and a reverse blocking device requires a hole discharge possibility for negative bias of the drain with respect to the source and a retention of holes in the drift control zone in an on-state of the FET.

In the on-state, i.e. for gate to source voltages $V_{GS}>0V$ the switch 138 is open. In an off-state, i.e. for gate to source voltages $V_{GS}\leq 0V$ the switch 138 is closed and allows for a discharge of thermally generated electrons or holes to the drain.

Figure 2:
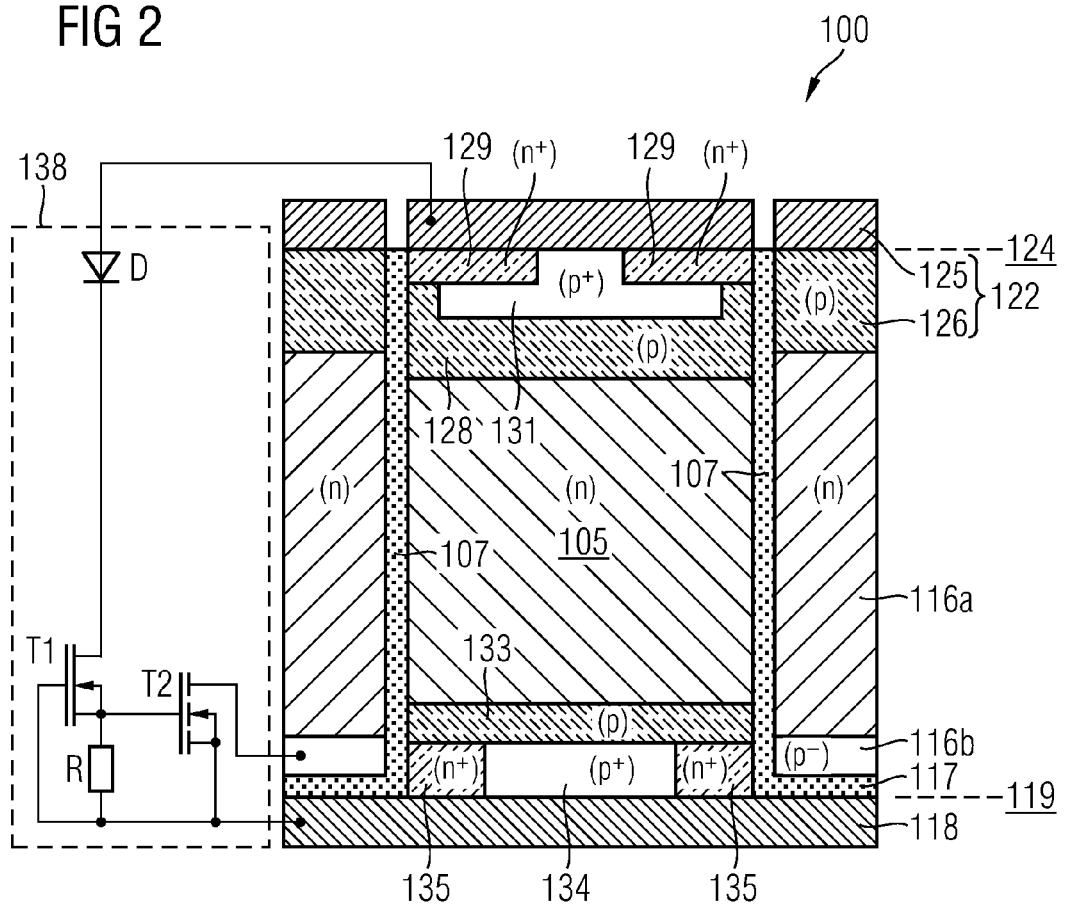
FIG. 2 illustrates a schematic cross-sectional view of one embodiment of a semiconductor device in accordance with an embodiment providing a reverse blocking capability by a switch circuit between the drift control zone and a drain electrode.

In the schematic view of FIG. 2, details of the switch 138 schematically illustrated in FIG. 1 are given. The switch 138 is configured to discharge electrons from the n-doped drift control zone 106 to the drain electrode 118 for positive bias at the drain electrode 118 and to discharge holes from the n-doped drift control zone 106 to the drain electrode 118 for negative bias at the drain electrode 118.

In the embodiment illustrated in FIG. 2, the switch 138 includes a diode D, first and second FETs T1, T2 and a resistor R.

FET T2 allows for a discharge of leakage currents from the drift control zone 106 to the drain electrode 118. A voltage at a gate of FET T2 can be adjusted by FET T1 and the resistor R. FET T1 may be configured as normally-on such that a voltage at a source of FET T1 can exceed a voltage at a gate of FET T1 by at most several volts, e.g. by at most +10V to +15V. The gate of FET T2 and the drain of FET T2 are shorted. In this operation mode, FET T1 is turned on and a charge in the n-doped drift control zone 106 can be discharged to the drain electrode 118.

In a first blocking mode such as for a source voltage of 0V, drain voltage of 400V, and gate voltage of 0V, diode D blocks. Thus, a voltage of a source of FET T2 and a voltage of a gate of FET T1 correspond to a voltage at the drain electrode 118. A channel of FET T2 is turned off. A body diode of the FET T2 is forward biased and conducts thermally generated electrons from the n-doped drift control zone 106 to the drain electrode 118.

In a second blocking mode such as for a source voltage of 0V, drain voltage of −400V, and gate voltage of 0V, diode D is forward biased. A voltage of the source of FET T1 is a pinch-off voltage of e.g. −390V. A cross current is defined by the resistor R which may be high-ohmic. FET T2 is turned on and conducts thermally generated holes from the n-doped drift control zone 106 to the drain electrode 118.

In an on-state of the semiconductor device 100 such as for a source voltage of 0V, drain voltage of smaller than 1V, gate voltage and voltage of the n-doped drift control zone 106 of e.g. 15V, the gate of FET T2 is discharged via resistor R to a voltage of the source of FET T2. Hence, FET T2 is in a blocking mode and a charge remains in the n-doped drift control zone 106.

The above values of voltages at the source, gate and drain of FETs T1 and T2 are exemplary values and may depend upon voltage blocking capabilities and threshold voltages.

In a reverse operation mode, the semiconductor device 100 cannot be turned on. Functionality of the device 100 is fully enabled via gate, source and drain.

When adding or replacing diode D by a further switch that is connected in series and can be switched into a blocking mode for negative voltages at the drain electrode 118, semiconductor device 100 can be turned on at a negative drain voltage by opening the further switch and, thereby, suppressing current flow from the source electrode 130 to the drain electrode 118. FET T2 is in a blocking mode and the semiconductor device 100 can be switched on via a voltage at the gate electrode 122. When the further switch is closed, i.e. in an on-state and/or when a control current flows via FET T1 and resistor R to the drain electrode 118, FET T2 is turned on and a gate charge/a charge in the drift control zone 106 is drained off to the drain electrode 118. Also in this direction of operation, the semiconductor device 100 can be turned off.

Figure 3A:
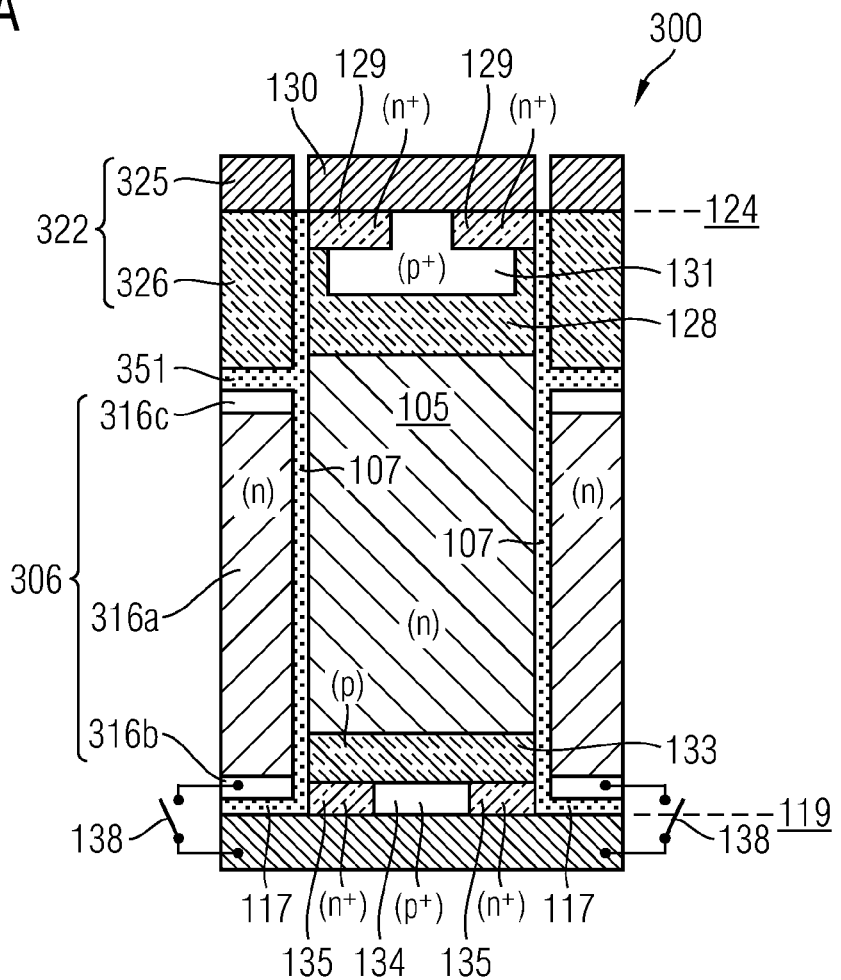
FIG. 3A illustrates a schematic cross-sectional view of yet another embodiment of a semiconductor device including a drift zone and a drift control zone and a switch circuit between the drift control zone and a drain electrode.

In the embodiments illustrated in FIGS. 1A to 2, the semiconductor device 100 is an EGFET. The above-described features likewise apply to a TEDFET such as TEDFET 300 illustrated in FIG. 3A. While the drift control zone 106 and the gate electrode 122 of the EGFET illustrated in FIG. 2 are electrically coupled, a drift control zone 306 of the TEDFET 300 is controlled independent of a gate electrode 322. To this end, an isolation layer 351 is arranged between the gate electrode 322 and the drift control zone 306 and provides an electrical isolation. The gate electrode 322 includes a connecting electrode 325 and a conductive material 326, e.g. doped semiconductor material(s), metal(s), metal compound (s) or any combination thereof. The drift control zone 306 includes, similar to the EGFET illustrated in FIG. 2, a first n-doped drift control subregion 316a and a second p-doped drift control subregion 316b, and, in addition, a third p-doped drift control subregion 316c. The first n-doped drift control subregion 316a is interposed between the second and third p-doped drift control subregions 316b, 316c.

The drift control zone 306 may be biased with respect to the source electrode 130. In view of a large internal capacitor between the drift control zone 306 and the drift zone 105, a respective control charge is also high and may result in increased losses. Additional capacitors between the third p-doped drift control region 316c and the source electrode 130 as well as between the second p-doped drift control region 316b and the drain electrode 118 allow for storage of a substantial part of the control charge and for a reduction of a charge amount supplied by a driver circuit. These additional capacitors may be external capacitors and/or may be monolithically integrated. In this case, the control charge may oscillate between the additional capacitors and a capacitor formed between the drift zone 105 and the drift control zone 306. A voltage source with an optional switch may be electrically coupled between the third p-doped drift control region 316c and the source electrode 130. In this case the control charge may oscillate between the drift control zone 306 and the voltage source. The optional switch may be a diode, for example.

In many AC (alternating current) voltage applications, switching-on at a voltage zero point is desirable in view of reduction of feedback to a source or power line and in view of reduction of disturbance pulses. The embodiments of semiconductor devices described above can be switched on at both voltage zero points, i.e. at a transition from the forward operation mode to the reverse operation mode and from the reverse operation mode to the forward operation mode. Further, the semiconductor devices described above can be switched-on and switched-off anytime in the forward operation mode. Compared to anti-serial connections of non-reverse blocking TEDFETs or EGFETs for achieving reverse blocking functionality, chip area may be substantially reduced with respect to a same on-state resistance. Since both FETs conduct current in anti-serial connection, each one of the two FETs contributes to the on-state resistance. Compared with a reverse blocking TEDFET or EGFET as described above, each one of the non-reverse blocking TEDFETs or EGFETs connected in series has to be designed twice as large as the reverse blocking TEDFET or EGFET. Then, the on-state resistance of each one of the non-reverse blocking TEDFETs or EGFETs equals or is close to half of the on-state resistance of reverse blocking TEDFET or EGFET and the overall on-state resistance of both non-reverse blocking TEDFETs or EGFETs connected in series equals or is close to the on-state resistance of reverse blocking TEDFET or EGFET described above. The reverse blocking TEDFET or EGFET described above allows for an area-efficient implementation of reverse conductivity. The reverse blocking TEDFET or EGFET utilizes the same drift region in both blocking directions. To reach reverse blocking operation with non-reverse blocking switches like known EGFETs or TEDFETs, an anti-serial connection is needed. Thus, with known non-reverse blocking switches two drift regions are in current flow mode. The resistance of the drift region is a dominant effect contributing to the on-state losses of a high-voltage switch, so that a reverse-blocking TEDFET or EGFET has about half of the on-state resistance compared with two anti-serial TEDFETs or EGFETs with each the same chip area.

Even when switching-on is required at any time of applied AC voltage, anti-parallel connection of two reverse blocking semiconductor devices as described above meets the demands. Since merely one of the two semiconductor devices conducts current in an anti-parallel connection, a chip area reduction of 50% may be achieved compared with an anti-serial connection having the same on-state resistance.

Figure 3B:
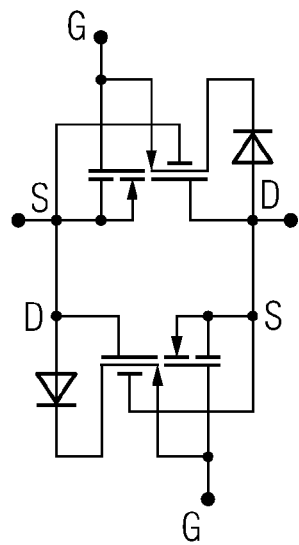
FIG. 3B illustrates a circuit diagram of an anti-parallel connection of two reverse blocking semiconductor devices according to an embodiment.

If an increased on-state resistance is temporarily acceptable, e.g. in low frequency applications, the FET which is in forward-mode operation, i.e. where the drain voltage is more positive than the source voltage can be switched on. This results in a decrease of the voltage drop over the FETs connected anti-parallel below some volts. At this period of time, the other one of the two FETs connected anti-parallel that has previously been in reverse operation mode can be switched-on resulting in both FETs conducting current in anti-parallel connection. A further reduction of chip area can thus be achieved. FIG. 3B is an exemplary illustration of an anti-parallel connection of two reverse blocking semiconductor devices including gate G, drain D, source S and a body-drain diode. The two reverse blocking semiconductor devices may be monolithically integrated on the same semiconductor die or disposed in separate semiconductor dies.

Figure 4A:
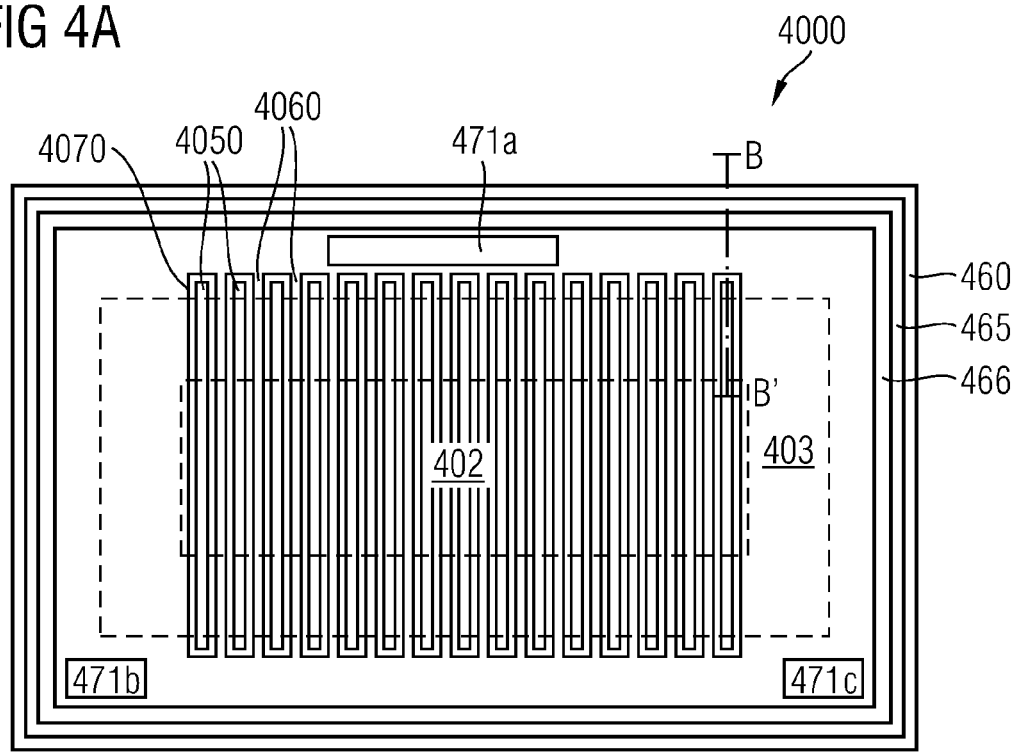
FIGS. 4A and 4B illustrate respective schematic top views of embodiments of a semiconductor device including drift zones and drift control zones in a transistor cell array, a junction termination area surrounding the transistor cell array and a semiconductor switch area for providing a reverse blocking capability of the semiconductor device.

FIG. 4A illustrates a schematic top view of one embodiment of a semiconductor device 4000 including drift zones 4050 and drift control zones 4060 in a transistor cell array 402. The drift zones 4050 are surrounded by a first dielectric 4070. A junction termination area 403 surrounds the transistor cell array 402.

Conductive structures 460, 466 electrically isolated by a dielectric 465 electrically couple a potential of a drain electrode at a rear side and a drift control zone, respectively, to a front side. Auxiliary circuit elements such as circuit elements of the switch 138 illustrated in FIGS. 1 to 3A may be arranged in an area between the conductive structures 460, 466 and the junction termination area 403, e.g. in areas 471a, 471b, 471c.

The areas 471a, 471b, 471c may be located e.g. in the corners of the semiconductor device 4000 and/or may be located outside of the conductive structure 460.

Figure 4B:
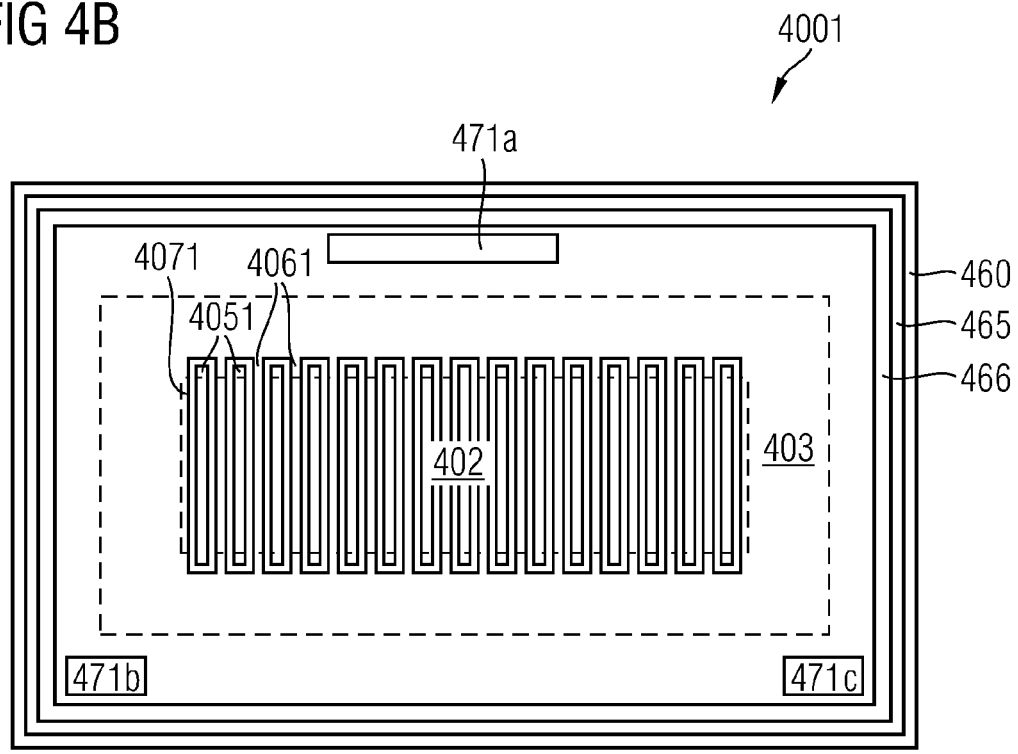

FIG. 4B illustrates a schematic top view of another embodiment of a semiconductor device 4001 including drift zones 4051 and drift control zones 4061 in a transistor cell array 402. The drift zones 4051 are surrounded by a first dielectric 4071. Other than in the semiconductor device 4000 illustrated in FIG. 4A, the drift zones 4051 and the first dielectric 4071 end within the junction termination area 403.

FIG. 5A illustrates a schematic cross-sectional view of a symmetric junction termination area 550 including field plates 552, 553 in a semiconductor device according to an embodiment. The schematic cross-section is taken along line BB' of FIG. 4A, for example, and may have the transistor cell array 402 on the right side of FIG. 5A. An insulating structure 554 is arranged between the field plates 552, 553 and a semiconductor body 510. The symmetric junction termination area 550 may be part of any one of the semiconductor devices described above with reference to FIGS. 1 to 3B. A drain electrode 518 at a second side 519 of the semiconductor body 510 is electrically coupled to a contact 556 at a first side 524 of the semiconductor body 510 by a first conductive structure 560 and a connection line 591. The connection line 591 is illustrated in a simplified manner by a line and may include element(s) of a wiring area such as contact plugs and/or metal wiring(s). The contact 556 may be part of or be continuously formed with the field plate 553 or may also be electrically coupled to the field plate 553 by an intermediate conductor. Likewise a source contact 557 may be part of or be continuously formed with the field plate 552 or may also be electrically coupled to the field plate 552 by an intermediate conductor.

In the embodiment illustrated in FIG. 5A, the first conductive structure 560 includes a p-doped interconnection region electrically coupling a p-doped semiconductor region 533 at the second side 519 to a p-doped region 528 at the first side 524. The first conductive structure 560 is electrically isolated from a first n-doped drift control subregion 516a and a second p-doped drift control subregion 516b of a drift zone 506 by a dielectric 565. A second conductive structure 566, e.g. a p-doped interconnection region provides an electrical connection between the first and second sides 524, 519 and allows for an electrical coupling of the second p-doped drift control subregion 516b to circuit elements at the first side 524, e.g. the switch 138 of FIG. 1A that may be implemented in areas such as areas 571a, 571b, 571c of FIGS. 4A and 4B. As an example, the second conductive structure 566 brings the potential of the p-doped drift control subregion 516b to the drain of FET T2 as shown in FIG. 2.

FIG. 5B illustrates a schematic cross-sectional view of another embodiment of a symmetric junction termination area 580. The symmetric junction termination area 580 differs from the symmetric junction termination area 550 illustrated in FIG. 5A in that p-doped guard rings 582 contribute to a lateral reduction of the electric field instead of the field plates 552, 553 as illustrated in FIG. 5A.

Examples of junction termination areas are illustrated in FIGS. 5A and 5B. The exemplary junction termination structures illustrated in FIGS. 5A and 5B may also be combined. Further junction termination structures such as Junction Termination Extension (JTE) structures and/or Variation of Lateral Doping (VLD) structures may form part of the junction termination area 550, 580.

Figure 6A:
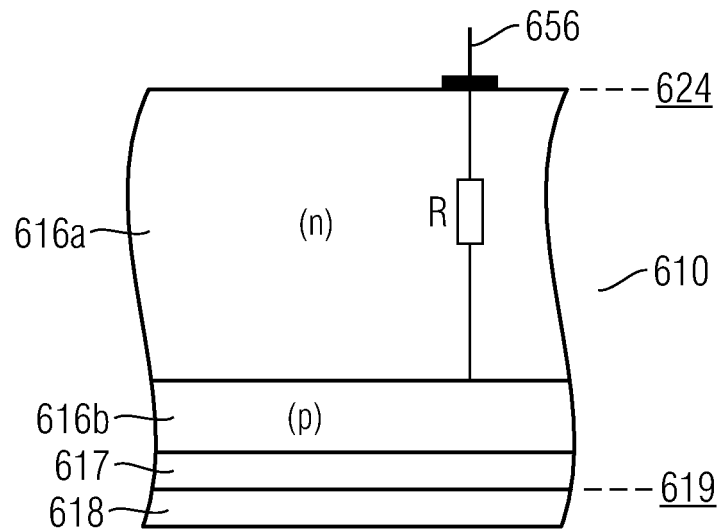
FIG. 6A illustrates a schematic cross-sectional view of an embodiment providing an electrical connection of a buried subregion of the drift control zone to a first side of a semiconductor body.

FIG. 6A illustrates a schematic cross-sectional view of an embodiment of providing an electrical connection of a second p-doped drift control subregion 616b at a second side 619 of a semiconductor body 610 to a contact 656 at a first side 624 of the semiconductor body 610. The second p-doped drift control subregion 616b adjoins a second dielectric 617 at the second side 619 of the semiconductor body 610 and a first n-doped drift control subregion 616a. The electrical connection is illustrated in a simplified manner by a resistor R. The resistor R includes one or a plurality of conductive materials.

Figure 6B:
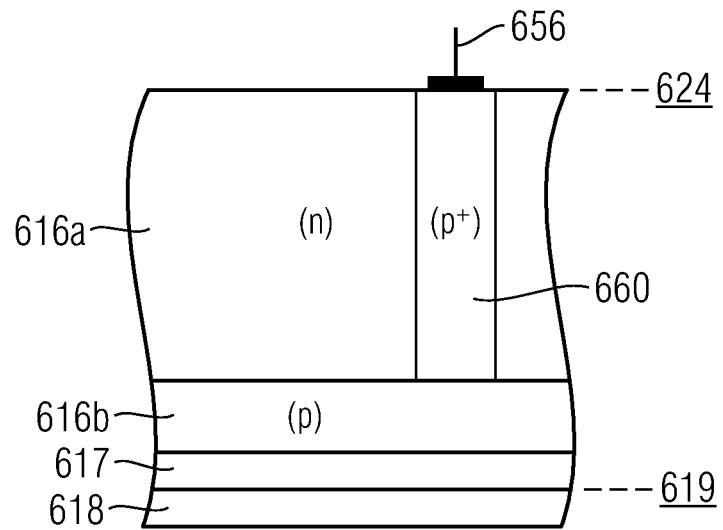
FIG. 6B illustrates one example of the electrical connection between the buried subregion of the drift control zone and the first side by a $p^+$-doped region.

In the embodiment illustrated in FIG. 6B, the resistor R includes a p+-doped semiconductor region 660 that may be a filling material of a trench and/or be diffused into the semiconductor body 610 from the first side 624.

Figure 6C:
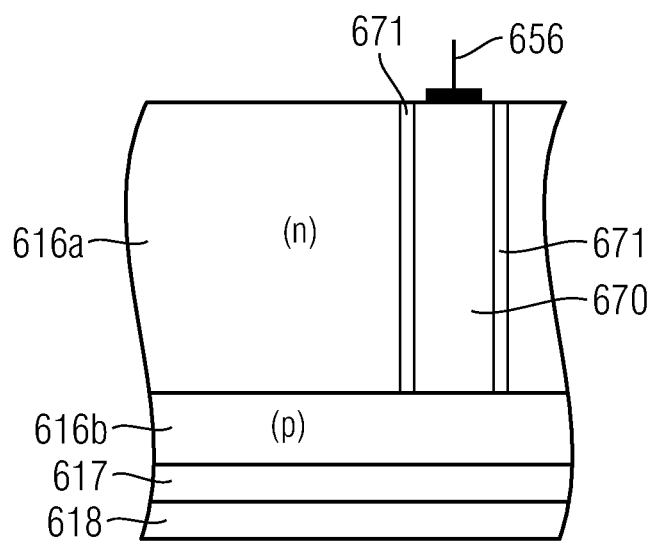
FIG. 6C illustrates another example of the electrical connection between the buried subregion of the drift control zone and the first side by a trench filled with conductive material electrically isolated from a surrounding part of a semiconductor body by an insulating layer at sidewalls of the trench.

In the embodiment illustrated in FIG. 6C, the resistor R includes a conductive material 670 filled into a trench and electrically isolated from a surrounding part of the semiconductor body 610 by an isolating layer 671. The conductive material 670 may include metal(s), metal compound(s), doped semiconductor(s) and any combination thereof.

Figure 7A:
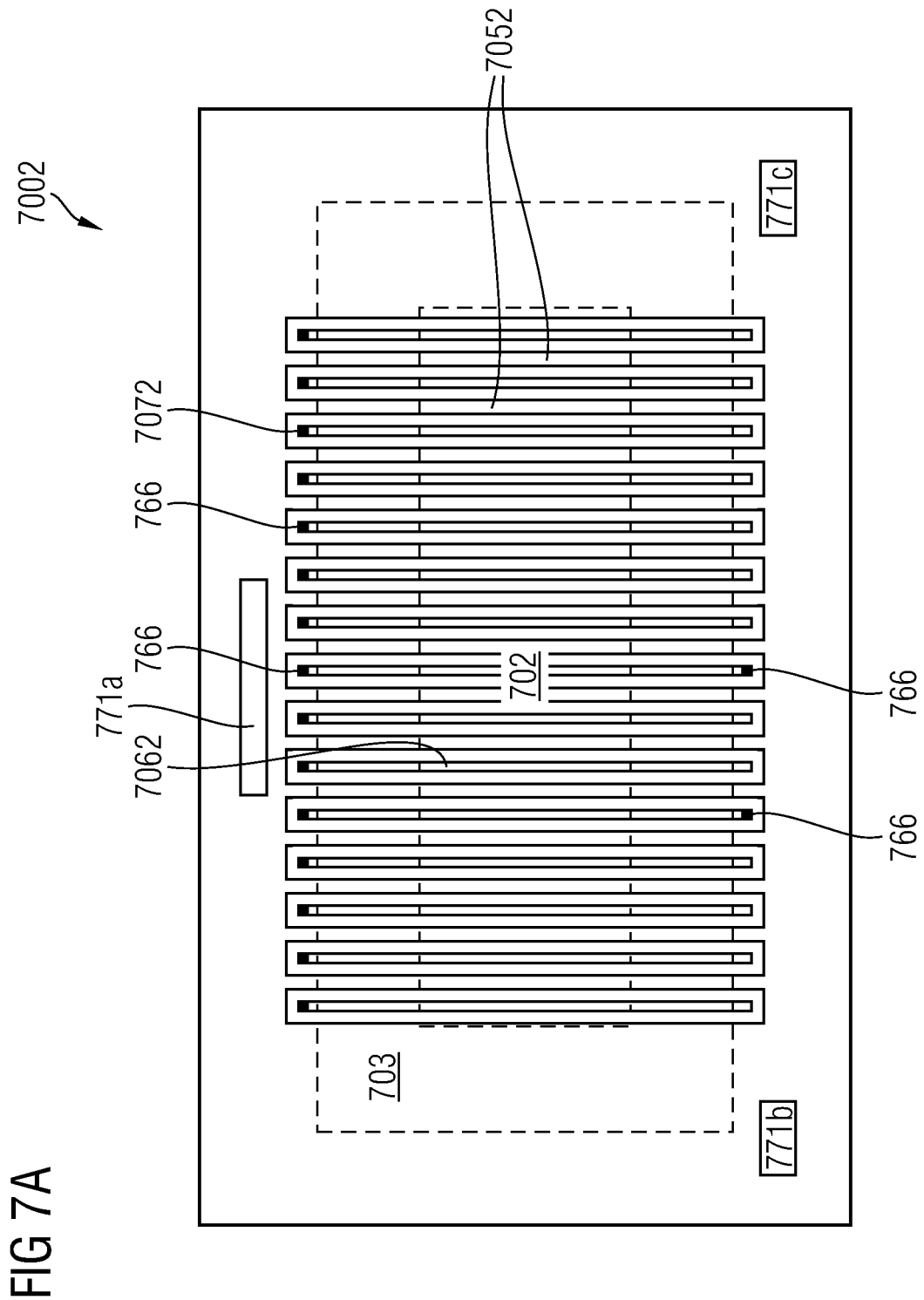
FIG. 7A illustrates a schematic top view of a semiconductor device including drift zones and drift control zones in a transistor cell array.

FIG. 7A illustrates a schematic top view of another embodiment of a semiconductor device 7002 including drift zones 7052 and drift control zones 7062 in a transistor cell array 702 surrounded by a junction termination area 703. Other than in the semiconductor devices 4000, 4001 illustrated in FIGS. 4A, 4B, the drift control zones 7062 are surrounded by a first dielectric 7072. A second conductive structure 766, e.g. a p-doped interconnection region allows for an electrical coupling of a second p-doped drift control subregion at a second side and circuit elements at a first side, e.g. the switch 138 of FIG. 1A that may be implemented in areas such as areas 771a, 771b, 771c of FIGS. 5A and 5B at the first side. The second conductive structure 766 may be arranged at one end or at both ends of stripe-shaped drift control zones 7062, for example.

Figure 7B:
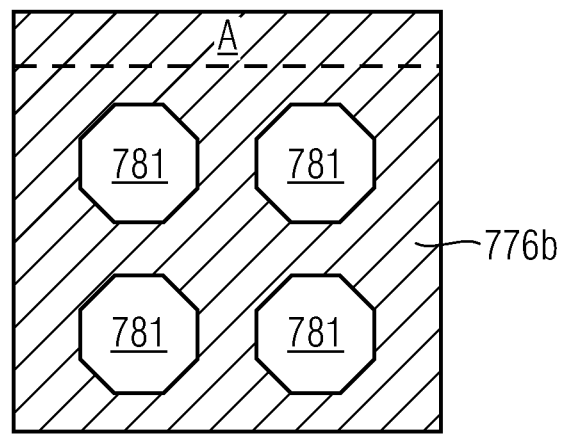
FIG. 7B illustrates a schematic top view of a continuous p-doped subregion of a drift control zone including openings according to another embodiment.

FIG. 7B illustrates a schematic top view of a continuous second p-doped drift control subregion 776b extending from a transistor cell array to an area A where the second p-doped drift control subregion 776b is electrically coupled to a contact at the first side as illustrated in the examples of FIGS. 6A to 6C. The continuous second p-doped drift control subregion 776b includes openings 781. According to an embodiment, a first n-doped drift control subregion fills the openings 781.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
  a semiconductor body including a drift zone of a first conductivity type and a drift control zone;
  a junction termination structure at a first side of the semiconductor body;
  a first dielectric between the drift zone and the drift control zone;
  a drain electrode at a second side of the semiconductor body; and
  a second dielectric at the second side of the semiconductor body and in contact with the drain electrode,
  wherein the drift control zone includes a first drift control subregion of the first conductivity type and a second drift control subregion of a second conductivity type between the first drift control subregion and the second dielectric.

2. The semiconductor device of claim 1, wherein the second drift control subregion includes at least one opening.

3. The semiconductor device of claim 2, wherein the first drift subcontrol region extends through the at least one opening to the second dielectric.

4. The semiconductor device of claim 1, wherein the second drift control subregion extends from an area inside the junction termination structure to an area outside the junction termination structure.

5. The semiconductor device of claim 1, wherein the second drift control subregion is electrically coupled to a first contact at the first side via an interconnection element extending through the semiconductor body between the second drift control subregion and the first contact.

6. The semiconductor device of claim 5, wherein the interconnection element includes at least one of a doped semiconductor region of the second conductivity type and a metal.

7. The semiconductor device of claim 5, wherein the interconnection element is arranged outside the junction termination structure.

8. The semiconductor device of claim 5, further comprising circuit elements laterally between the interconnection element and the junction termination structure.

9. The semiconductor device of claim 8, wherein the circuit elements include at least one of a transistor, a diode and a resistor.

10. The semiconductor device of claim 1, further comprising a switch electrically coupled between the second drift control subregion and the drain electrode of the semiconductor device at the second side.

11. The semiconductor device of claim 10, wherein the switch is a lateral level-shift transistor.

12. The semiconductor device of claim 1, wherein the drift zone adjoins a first pn junction at the first side and a second pn junction at the second side.

13. The semiconductor device of claim 12, wherein a concentration of dopants of the first conductivity type is constant along a vertical direction between the first pn junction and the second pn junction.

14. The semiconductor device of claim 1, wherein a net doping concentration of the first drift control subregion corresponds to the net doping concentration in a respective part of the drift zone.

15. The semiconductor device of claim 1, further comprising:
  a first semiconductor region of the second conductivity type between the drift zone and an electrode at the second side; and
  a second semiconductor region of the first conductivity type adjoining the second dielectric and the electrode,
  wherein a part of the first semiconductor region adjoining the second dielectric is confined between the drift zone and the second semiconductor region.

16. The semiconductor device of claim 1, wherein the junction termination structure is a symmetrical junction termination structure.

17. The semiconductor device of claim 16, wherein the symmetrical junction termination structure includes at least one of field plates and doped semiconductor rings.

18. The semiconductor device of claim 1, wherein the semiconductor device is a vertical FET.

19. The semiconductor device of claim 1, wherein the semiconductor device is one of a trench extended drain region FET and an extended gate FET.

20. The semiconductor device of claim 1, wherein the semiconductor device is a reverse-blocking semiconductor device.

21. The semiconductor device of claim 1, further comprising:

a body region of the second conductivity type between the drift zone and an electrode at the first side; and a gate electrode and a gate dielectric between the gate electrode and the body region, wherein the gate electrode adjoins the drift control zone.

22. The semiconductor device of claim 1, further comprising:

a body region of the second conductivity type between the drift zone and an electrode at the first side;

a gate electrode and a gate dielectric between the gate electrode and the body region; and a dielectric arranged between the gate electrode and the drift control zone.

23. A semiconductor component comprising an anti-parallel connection of a first semiconductor device according to claim 1 and a second semiconductor device according to claim 1.

24. The semiconductor component of claim 23, wherein the first and second semiconductor devices are monolithically integrated on the same semiconductor die.

25. The semiconductor component of claim 23, wherein the first and second semiconductor devices are disposed in separate semiconductor dies.

\* \* \* \* \*